United States Patent
McKerrow et al.

(10) Patent No.: US 10,454,029 B2
(45) Date of Patent: Oct. 22, 2019

(54) METHOD FOR REDUCING THE WET ETCH RATE OF A SIN FILM WITHOUT DAMAGING THE UNDERLYING SUBSTRATE

(71) Applicant: Lam Research Corporation, Fremont, CA (US)

(72) Inventors: Andrew John McKerrow, Lake Oswego, OR (US); Dennis M. Hausmann, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/349,753

(22) Filed: Nov. 11, 2016

(65) Prior Publication Data

US 2018/0138405 A1    May 17, 2018

(51) Int. Cl.
  *H01L 21/02*   (2006.01)
  *C23C 16/04*   (2006.01)
  (Continued)

(52) U.S. Cl.
  CPC .......... *H01L 45/16* (2013.01); *C23C 16/345* (2013.01); *C23C 16/4554* (2013.01);
  (Continued)

(58) Field of Classification Search
  CPC ..... C23C 16/325; C23C 16/345; C23C 16/36; C23C 16/45534; C23C 16/4554; H01L 21/0234; H01L 21/02167; H01L 21/02208; H01L 21/02211; H01L 21/31111; H01L 21/0228; H01L 21/02274; H01L 21/0217
  See application file for complete search history.

(56) References Cited

U.S. PATENT DOCUMENTS 4,158,717 A    6/1979  Nelson
4,500,563 A    2/1985  Ellenberger et al.
(Continued)

FOREIGN PATENT DOCUMENTS

CN    1732288 A    2/2006
CN    1841676 A    10/2006
(Continued)

OTHER PUBLICATIONS

U.S. Office Action dated Apr. 18, 2016 issued in U.S. Appl. No. 14/935,317.
(Continued)

*Primary Examiner* — Brian Turner
(74) *Attorney, Agent, or Firm* — Weaver Austin Villeneuve & Sampson LLP

(57) ABSTRACT

Methods and apparatuses for forming conformal, low wet etch rate silicon nitride films having low hydrogen content using atomic layer deposition are described herein. Methods involve depositing a silicon nitride film at a first temperature using a bromine-containing and/or iodine-containing silicon precursor and nitrogen by atomic layer deposition and treating the silicon nitride film using a plasma at a temperature less than about 100° C. Methods and apparatuses are suitable for forming conformal, dense, low wet etch rate silicon nitride films as encapsulation layers over chalcogenide materials for memory applications.

22 Claims, 6 Drawing Sheets

(51) Int. Cl.
*H01L 21/31* (2006.01)
*H01L 21/768* (2006.01)
*H01L 45/00* (2006.01)
*C23C 16/34* (2006.01)
*C23C 16/56* (2006.01)
*C23C 16/455* (2006.01)

(52) U.S. Cl.
CPC .............. *C23C 16/56* (2013.01); *H01L 45/06* (2013.01); *H01L 45/12* (2013.01); *H01L 45/1233* (2013.01); *H01L 45/144* (2013.01)

(56) References Cited

U.S. PATENT DOCUMENTS

| | | | |
|---|---|---|---|
| 4,575,921 A | 3/1986 | Bhagat | |
| 4,869,781 A | 9/1989 | Euen et al. | |
| 5,091,332 A | 2/1992 | Bohr et al. | |
| 5,230,929 A | 7/1993 | Caporiccio et al. | |
| 5,314,724 A | 5/1994 | Tsukune et al. | |
| 5,459,099 A | 10/1995 | Hsu | |
| 5,496,608 A | 3/1996 | Matsuda et al. | |
| 5,528,719 A | 6/1996 | Yamada | |
| 5,670,432 A | 9/1997 | Tsai | |
| 5,731,235 A | 3/1998 | Srinivasan et al. | |
| 5,854,105 A | 12/1998 | Tseng | |
| 5,856,003 A | 1/1999 | Chiu | |
| 5,891,805 A | 4/1999 | Cheng et al. | |
| 5,976,990 A | 11/1999 | Mercaldi et al. | |
| 6,039,834 A | 3/2000 | Tanaka et al. | |
| 6,153,519 A | 11/2000 | Jain et al. | |
| 6,197,701 B1 | 3/2001 | Shue et al. | |
| 6,225,175 B1 | 5/2001 | Houston | |
| 6,228,779 B1 | 5/2001 | Bloom et al. | |
| 6,326,322 B1 | 12/2001 | Kim et al. | |
| 6,380,056 B1 | 4/2002 | Shue et al. | |
| 6,395,652 B2 | 5/2002 | Kim et al. | |
| 6,403,416 B1 | 6/2002 | Huang et al. | |
| 6,416,822 B1 | 7/2002 | Chiang et al. | |
| 6,428,859 B1 | 8/2002 | Chiang et al. | |
| 6,518,167 B1 | 2/2003 | You et al. | |
| 6,534,395 B2 | 3/2003 | Werkhoven et al. | |
| 6,548,368 B1 | 4/2003 | Narwankar et al. | |
| 6,632,478 B2 | 10/2003 | Gaillard et al. | |
| 6,632,741 B1 | 10/2003 | Clevenger et al. | |
| 6,638,879 B2 | 10/2003 | Hsieh et al. | |
| 6,645,574 B1 | 11/2003 | Lee et al. | |
| 6,709,928 B1 | 3/2004 | Jenne et al. | |
| 6,730,614 B1 | 5/2004 | Lim et al. | |
| 6,794,284 B2 | 9/2004 | Vaartstra | |
| 6,926,798 B2 | 8/2005 | Biberger et al. | |
| 6,933,245 B2 | 8/2005 | Lee et al. | |
| 6,967,159 B2 | 11/2005 | Vaartstra | |
| 7,019,159 B2 | 3/2006 | Dussarrat et al. | |
| 7,041,335 B2 | 5/2006 | Chung | |
| 7,163,860 B1 | 1/2007 | Kamai et al. | |
| 7,172,792 B2 | 2/2007 | Wang et al. | |
| 7,297,641 B2 | 11/2007 | Todd et al. | |
| 7,300,885 B2 | 11/2007 | Hasebe et al. | |
| 7,301,210 B2 | 11/2007 | Abadeer et al. | |
| 7,351,668 B2 | 4/2008 | Chou et al. | |
| 7,372,118 B2 | 5/2008 | Asao et al. | |
| 7,462,571 B2 | 12/2008 | Hasebe et al. | |
| 7,465,669 B2 | 12/2008 | Iyer et al. | |
| 7,482,247 B1 | 1/2009 | Papasouliotis et al. | |
| 7,507,676 B2 | 3/2009 | Chou et al. | |
| 7,510,984 B2 | 3/2009 | Saito et al. | |
| 7,514,366 B2 | 4/2009 | Trivedi et al. | |
| 7,611,980 B2 | 11/2009 | Wells et al. | |
| 7,622,369 B1 | 11/2009 | Lee et al. | |
| 7,629,267 B2 | 12/2009 | Wan et al. | |
| 7,651,730 B2 | 1/2010 | Hasebe | |
| 7,651,953 B2 | 1/2010 | Todd et al. | |
| 7,651,959 B2 | 1/2010 | Fukazawa et al. | |
| 7,682,657 B2 | 3/2010 | Sherman | |
| 7,713,592 B2 | 5/2010 | Nguyen et al. | |
| 7,732,343 B2 | 6/2010 | Niroomand et al. | |
| 7,745,346 B2 | 6/2010 | Hausmann et al. | |
| 7,758,920 B2 | 7/2010 | Hasebe et al. | |
| 7,807,578 B2 | 10/2010 | Bencher et al. | |
| 7,825,039 B2 | 11/2010 | Takahashi et al. | |
| 7,910,288 B2 | 3/2011 | Abatchev et al. | |
| 7,910,497 B2 | 3/2011 | Olsen et al. | |
| 7,919,416 B2 | 4/2011 | Lee et al. | |
| 7,939,455 B2 | 5/2011 | Clark | |
| 7,964,241 B2 | 6/2011 | Hasebe et al. | |
| 7,964,513 B2 | 6/2011 | Todd et al. | |
| 7,989,365 B2 | 8/2011 | Park et al. | |
| 8,034,673 B2 | 10/2011 | Kadonaga et al. | |
| 8,080,290 B2 | 12/2011 | Hasebe et al. | |
| 8,084,088 B2 | 12/2011 | Huy et al. | |
| 8,105,901 B2 | 1/2012 | Cheng et al. | |
| 8,119,544 B2 | 2/2012 | Hasebe et al. | |
| 8,178,448 B2 | 5/2012 | Nodera et al. | |
| 8,227,032 B2 | 7/2012 | Dussarrat et al. | |
| 8,257,789 B2 | 9/2012 | Matsunaga et al. | |
| 8,298,628 B2 | 10/2012 | Yang et al. | |
| 8,298,954 B1 | 10/2012 | Arnold et al. | |
| 8,366,953 B2 | 2/2013 | Kohno et al. | |
| 8,383,525 B2 | 2/2013 | Raisanen et al. | |
| 8,394,466 B2 | 3/2013 | Hong et al. | |
| 8,586,390 B2 | 11/2013 | Tomioka | |
| 8,592,328 B2 | 11/2013 | Hausmann et al. | |
| 8,623,770 B1 | 1/2014 | Gao et al. | |
| 8,669,185 B2 | 3/2014 | Onizawa et al. | |
| 8,703,578 B2 | 4/2014 | Hoentschel et al. | |
| 8,728,956 B2 | 5/2014 | LaVoie et al. | |
| 8,753,984 B2 | 6/2014 | Murakami et al. | |
| 8,791,034 B2 | 7/2014 | Shealy et al. | |
| 8,846,484 B2 | 9/2014 | Lee et al. | |
| 8,936,977 B2 | 1/2015 | Hoentschel et al. | |
| 8,975,704 B2 | 3/2015 | Hoentschel et al. | |
| 9,023,693 B1 | 5/2015 | Lin et al. | |
| 9,023,737 B2 | 5/2015 | Beynet et al. | |
| 9,070,555 B2 | 6/2015 | Hausmann et al. | |
| 9,095,869 B2 | 8/2015 | Kilpi et al. | |
| 9,214,333 B1 | 12/2015 | Sims et al. | |
| 9,355,839 B2 | 5/2016 | Swaminathan et al. | |
| 9,390,909 B2 | 7/2016 | Pasquale et al. | |
| 9,406,693 B1 | 8/2016 | Pang et al. | |
| 9,443,731 B1 | 9/2016 | O'Meara et al. | |
| 9,472,506 B2 | 10/2016 | Conklin et al. | |
| 9,502,238 B2 | 11/2016 | Danek et al. | |
| 9,508,604 B1 | 11/2016 | Sung et al. | |
| 9,530,663 B1 | 12/2016 | Shih et al. | |
| 9,564,312 B2 | 2/2017 | Henri et al. | |
| 9,576,817 B1 | 2/2017 | Cheng et al. | |
| 9,589,790 B2 | 3/2017 | Henri et al. | |
| 9,601,693 B1 | 3/2017 | Henri et al. | |
| 9,670,579 B2 | 6/2017 | Hausmann et al. | |
| 9,721,784 B2 | 8/2017 | Behera et al. | |
| 9,865,815 B2 | 1/2018 | Hausmann et al. | |
| 9,875,891 B2 | 1/2018 | Henri et al. | |
| 9,892,933 B2 | 2/2018 | Peng et al. | |
| 10,074,543 B2 | 9/2018 | Mahorowala et al. | |
| 10,134,579 B2 | 11/2018 | Baldasseroni et al. | |
| 10,141,505 B2 | 11/2018 | Hausmann et al. | |
| 10,157,736 B2 | 12/2018 | van Schravendijk et al. | |
| 2002/0001889 A1 | 1/2002 | Kim et al. | |
| 2002/0001929 A1 | 1/2002 | Biberger et al. | |
| 2003/0143841 A1 | 7/2003 | Yang et al. | |
| 2004/0043570 A1 | 3/2004 | Fujisaki et al. | |
| 2005/0025885 A1 | 2/2005 | McSwiney et al. | |
| 2005/0042865 A1 | 2/2005 | Cabral et al. | |
| 2005/0100670 A1 | 5/2005 | Dussarrat et al. | |
| 2005/0109276 A1 | 5/2005 | Iyer et al. | |
| 2005/0118837 A1 | 6/2005 | Todd et al. | |
| 2005/0158983 A1 | 7/2005 | Hoshi et al. | |
| 2005/0159017 A1 | 7/2005 | Kim et al. | |
| 2005/0170104 A1* | 8/2005 | Jung .................... C23C 16/345 427/569 |
| 2005/0196977 A1 | 9/2005 | Saito et al. | |
| 2005/0227017 A1 | 10/2005 | Senzaki et al. | |
| 2005/0287309 A1 | 12/2005 | Veerasamy | |
| 2005/0287775 A1 | 12/2005 | Hasebe et al. | |

(56) References Cited

U.S. PATENT DOCUMENTS

| | | |
|---|---|---|
| 2006/0003557 A1 | 1/2006 | Cabral et al. |
| 2006/0008656 A1 | 1/2006 | Veerasamy |
| 2006/0084283 A1 | 4/2006 | Paranjpe et al. |
| 2006/0088985 A1 | 4/2006 | Haverkort et al. |
| 2006/0199357 A1 | 9/2006 | Wan et al. |
| 2006/0286776 A1 | 12/2006 | Ranish et al. |
| 2007/0054450 A1 | 3/2007 | Hong et al. |
| 2007/0080381 A1 | 4/2007 | Chien et al. |
| 2007/0099431 A1 | 5/2007 | Li |
| 2007/0137572 A1 | 6/2007 | Matsuura et al. |
| 2007/0167028 A1 | 7/2007 | Chou et al. |
| 2007/0218661 A1 | 9/2007 | Shroff et al. |
| 2007/0238316 A1 | 10/2007 | Ohashi |
| 2007/0251444 A1 | 11/2007 | Gros et al. |
| 2007/0298585 A1 | 12/2007 | Lubomirsky et al. |
| 2008/0038936 A1 | 2/2008 | Todd et al. |
| 2008/0063791 A1 | 3/2008 | Hasebe et al. |
| 2008/0081470 A1 | 4/2008 | Clark |
| 2008/0119057 A1 | 5/2008 | Chua et al. |
| 2008/0124946 A1 | 5/2008 | Xiao et al. |
| 2008/0138996 A1 | 6/2008 | Nishizuka |
| 2008/0139003 A1 | 6/2008 | Pirzada et al. |
| 2008/0213479 A1 | 9/2008 | Chou et al. |
| 2008/0237726 A1 | 10/2008 | Dyer |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0318443 A1 | 12/2008 | Kim et al. |
| 2009/0018668 A1 | 1/2009 | Galbraith |
| 2009/0075490 A1 | 3/2009 | Dussarrat |
| 2009/0146322 A1 | 6/2009 | Weling et al. |
| 2009/0148625 A1 | 6/2009 | Yeom et al. |
| 2009/0155606 A1 | 6/2009 | Yoon et al. |
| 2009/0163041 A1* | 6/2009 | Mungekar .............. C23C 16/345 438/792 |
| 2009/0191722 A1 | 7/2009 | Hasebe et al. |
| 2009/0286381 A1 | 11/2009 | van Schravendijk et al. |
| 2010/0003797 A1 | 1/2010 | Smith |
| 2010/0038727 A1 | 2/2010 | Chakravarthi et al. |
| 2010/0099271 A1 | 4/2010 | Hausmann et al. |
| 2010/0102407 A1 | 4/2010 | Kajiyama et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0151681 A1 | 6/2010 | Knapp et al. |
| 2010/0221925 A1 | 9/2010 | Lee et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003477 A1 | 1/2011 | Park et al. |
| 2011/0014795 A1 | 1/2011 | Lee et al. |
| 2011/0021010 A1 | 1/2011 | Cheng et al. |
| 2011/0086516 A1 | 4/2011 | Lee et al. |
| 2011/0127582 A1 | 6/2011 | Cheng et al. |
| 2011/0129978 A1 | 6/2011 | Cheng et al. |
| 2011/0151142 A1 | 6/2011 | Seamons et al. |
| 2011/0176967 A1 | 7/2011 | Okuda et al. |
| 2011/0183528 A1 | 7/2011 | Wang et al. |
| 2011/0244142 A1 | 10/2011 | Cheng et al. |
| 2011/0256734 A1 | 10/2011 | Hausmann et al. |
| 2012/0009802 A1 | 1/2012 | LaVoie et al. |
| 2012/0009803 A1 | 1/2012 | Jung et al. |
| 2012/0028469 A1 | 2/2012 | Onizawa et al. |
| 2012/0058282 A1 | 3/2012 | Hong et al. |
| 2012/0104347 A1 | 5/2012 | Quick |
| 2012/0108079 A1 | 5/2012 | Mahajani |
| 2012/0142194 A1 | 6/2012 | Hwang |
| 2012/0156882 A1 | 6/2012 | Lee et al. |
| 2012/0156888 A1 | 6/2012 | Sato et al. |
| 2012/0164846 A1 | 6/2012 | Ha et al. |
| 2012/0177841 A1 | 7/2012 | Thompson |
| 2012/0213940 A1 | 8/2012 | Mallick |
| 2012/0244711 A1 | 9/2012 | Yin et al. |
| 2012/0264305 A1 | 10/2012 | Nakano |
| 2012/0282418 A1 | 11/2012 | Chou et al. |
| 2012/0315394 A1 | 12/2012 | Ito |
| 2013/0071580 A1 | 3/2013 | Weidman et al. |
| 2013/0084688 A1 | 4/2013 | O'Meara et al. |
| 2013/0113073 A1 | 5/2013 | Liu et al. |
| 2013/0115783 A1 | 5/2013 | Kim et al. |
| 2013/0189845 A1 | 7/2013 | Kim et al. |
| 2013/0189854 A1 | 7/2013 | Hausmann et al. |
| 2013/0210236 A1 | 8/2013 | Ogihara et al. |
| 2013/0252437 A1 | 9/2013 | Sano et al. |
| 2013/0344248 A1 | 12/2013 | Clark |
| 2014/0023794 A1* | 1/2014 | Mahajani .............. C23C 16/325 427/535 |
| 2014/0030448 A1 | 1/2014 | Bowen et al. |
| 2014/0113455 A1* | 4/2014 | Reimer .............. H01L 21/0206 438/757 |
| 2014/0120737 A1 | 5/2014 | Swaminathan et al. |
| 2014/0134812 A1 | 5/2014 | Kim et al. |
| 2014/0141625 A1 | 5/2014 | Fukazawa et al. |
| 2014/0141626 A1 | 5/2014 | Hausmann et al. |
| 2014/0170853 A1 | 6/2014 | Shamma et al. |
| 2014/0193983 A1 | 7/2014 | LaVoie |
| 2014/0216337 A1 | 8/2014 | Swaminathan et al. |
| 2014/0262038 A1 | 9/2014 | Wang et al. |
| 2014/0273477 A1 | 9/2014 | Niskanen et al. |
| 2014/0273528 A1 | 9/2014 | Niskanen et al. |
| 2014/0273529 A1* | 9/2014 | Nguyen .............. H01L 21/0217 438/792 |
| 2014/0273530 A1 | 9/2014 | Nguyen et al. |
| 2014/0273531 A1 | 9/2014 | Niskanen et al. |
| 2014/0302686 A1 | 10/2014 | Pan et al. |
| 2014/0356549 A1 | 12/2014 | Varadarajan |
| 2015/0021712 A1 | 1/2015 | Zschaetzsch et al. |
| 2015/0031218 A1 | 1/2015 | Karakawa |
| 2015/0056540 A1 | 2/2015 | Fukuda |
| 2015/0126042 A1 | 5/2015 | Pasquale et al. |
| 2015/0137061 A1* | 5/2015 | Donghi .............. H01L 27/2463 257/4 |
| 2015/0155198 A1 | 6/2015 | Tsai et al. |
| 2015/0162416 A1 | 6/2015 | Chang et al. |
| 2015/0200110 A1 | 7/2015 | Li et al. |
| 2015/0243708 A1 | 8/2015 | Ravasio et al. |
| 2015/0249153 A1 | 9/2015 | Morin et al. |
| 2015/0259791 A1 | 9/2015 | Hausmann et al. |
| 2016/0020092 A1 | 1/2016 | Kang et al. |
| 2016/0046501 A1 | 2/2016 | Kverel et al. |
| 2016/0049307 A1 | 2/2016 | Chen |
| 2016/0064224 A1 | 3/2016 | Hung et al. |
| 2016/0079054 A1* | 3/2016 | Chen .............. H01L 21/0228 438/762 |
| 2016/0093484 A1 | 3/2016 | Marsh |
| 2016/0099143 A1 | 4/2016 | Yan et al. |
| 2016/0148800 A1 | 5/2016 | Henri et al. |
| 2016/0148806 A1 | 5/2016 | Henri et al. |
| 2016/0155739 A1 | 6/2016 | Ting et al. |
| 2016/0172194 A1 | 6/2016 | Kunnen et al. |
| 2016/0225640 A1 | 8/2016 | Raley et al. |
| 2016/0247678 A1 | 8/2016 | Feng et al. |
| 2016/0247680 A1 | 8/2016 | O'Meara et al. |
| 2016/0284567 A1 | 9/2016 | Reilly et al. |
| 2016/0293398 A1 | 10/2016 | Danek et al. |
| 2016/0293418 A1 | 10/2016 | Pasquale et al. |
| 2016/0300718 A1 | 10/2016 | Raley et al. |
| 2016/0336178 A1 | 11/2016 | Swaminathan et al. |
| 2016/0336187 A1 | 11/2016 | Liou et al. |
| 2016/0365425 A1 | 12/2016 | Chen et al. |
| 2016/0372334 A1 | 12/2016 | Mignot et al. |
| 2017/0069510 A1 | 3/2017 | Kal et al. |
| 2017/0092496 A1 | 3/2017 | deVilliers |
| 2017/0092857 A1 | 3/2017 | Hausmann et al. |
| 2017/0117134 A1 | 4/2017 | Henri et al. |
| 2017/0148637 A1 | 5/2017 | deVilliers |
| 2017/0170015 A1 | 6/2017 | Kim et al. |
| 2017/0170026 A1 | 6/2017 | Hudson et al. |
| 2017/0323785 A1 | 11/2017 | Singhal et al. |
| 2017/0323803 A1 | 11/2017 | van Schravendijk et al. |
| 2018/0005814 A1 | 1/2018 | Kumar et al. |
| 2018/0033622 A1 | 2/2018 | Swaminathan et al. |

(56) References Cited

U.S. PATENT DOCUMENTS

| | | |
|---|---|---|
| 2018/0061628 A1 | 3/2018 | Ou et al. |
| 2018/0061650 A1 | 3/2018 | Mahorowala |
| 2018/0114903 A1 | 4/2018 | Hausmann |
| 2018/0138028 A1 | 5/2018 | Henri et al. |
| 2018/0138036 A1 | 5/2018 | Baldasseroni et al. |
| 2018/0138040 A1 | 5/2018 | LaVoie |
| 2019/0080903 A1 | 3/2019 | Abel et al. |

FOREIGN PATENT DOCUMENTS

| | | |
|---|---|---|
| CN | 101006195 A | 7/2007 |
| CN | 101255548 A | 9/2008 |
| CN | 101328578 A | 12/2008 |
| CN | 101378007 A | 3/2009 |
| CN | 102471885 A | 5/2012 |
| CN | 103225071 A | 7/2013 |
| CN | 103515197 A | 1/2014 |
| EP | 0 277 766 | 8/1988 |
| EP | 2 278 046 A1 | 1/2011 |
| GB | 1 181 559 | 2/1970 |
| JP | 2005-210076 A | 8/2005 |
| JP | 2006-060091 | 3/2006 |
| JP | 2007-281181 A | 10/2007 |
| JP | 2008-517479 | 5/2008 |
| JP | 2010-10497 | 1/2010 |
| JP | 2010-283388 A | 12/2010 |
| JP | 2013225655 A | 10/2013 |
| JP | 2014-532304 A | 12/2014 |
| KR | 10-2009-0080019 | 7/2009 |
| KR | 10-2015-0025224 | 3/2015 |
| TW | 2010-33739 A | 9/2010 |
| TW | 2016-06855 A | 2/2016 |
| WO | WO 2006/018441 | 2/2006 |
| WO | WO 2006/026350 | 3/2006 |
| WO | WO 2011/130397 | 10/2011 |
| WO | WO 2013/043330 | 3/2013 |
| WO | WO 2013/066667 | 5/2013 |

OTHER PUBLICATIONS

U.S. Notice of Allowance dated Sep. 19, 2016 issued in U.S. Appl. No. 14/935,317.
U.S. Office Action dated May 19, 2017 issued in U.S. Appl. No. 15/272,222.
U.S. Notice of Allowance dated Sep. 1, 2017 issued in U.S. Appl. No. 15/272,222.
U.S. Office Action dated Jul. 3, 2017 issued in U.S. Appl. No. 15/279,310.
U.S. Final Office Action dated Feb. 21, 2018 issued in U.S. Appl. No. 15/279,310.
U.S. Office Action dated Apr. 7, 2017 issued in U.S. Appl. No. 15/279,314.
U.S. Final Office Action dated Oct. 19, 2017 issued in U.S. Appl. No. 15/279,314.
Aboaf, J.A. (1969) "Some Properties of Vapor Deposited Silicon Nitride Films Obtained by the Reaction of SiBr4 and NH 3," *Journal of the Electrochemical Society*, 116(12):1736-1740.
Lin et al., (1998) "Silicon Nitride Films Deposited by Atmospheric Pressure Chemical Vapor Deposition," *Materials Research Society Symposium Proceedings* vol. 495, *Chemical Aspects of Electronic Ceramics Processing, Symposium* held Nov. 30-Dec. 4, 1997, Boston, Massachusetts, U.S.A., 8 pages.
*Wikipedia, The Free Encyclopedia*, Definition of "Silicon Nitride," Archived from Apr. 9, 2015, 1 page [Downloaded on Oct. 12, 2017 from https://web.archive.org/web/20150409055521/https://en.wikipedia.org/wiki/Silicon_nitride].
U.S. Notice of Allowance dated Aug. 18, 2015 issued in U.S. Appl. No. 14/494,914.
U.S. Office Action dated Oct. 1, 2015 issued in U.S. Appl. No. 14/552,245.
U.S. Notice of Allowance dated Feb. 1, 2016 issued in U.S. Appl. No. 14/552,245.
U.S. Office Action dated May 24, 2016 issued in U.S. Appl. No. 14/552,245.
U.S. Notice of Allowance dated Oct. 26, 2016 issued in U.S. Appl. No. 14/552,245.
U.S. Office Action dated May 25, 2016 issued in U.S. Appl. No. 14/552,011.
U.S. Notice of Allowance dated Sep. 26, 2016 issued in U.S. Appl. No. 14/552,011.
U.S. Notice of Allowance dated Sep. 28, 2017 issued in U.S. Appl. No. 15/399,637.
U.S. Notice of Allowance dated Jul. 15, 2016 issued in U.S. Appl. No. 14/678,736.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated Apr. 11, 2014 issued in U.S. Appl. No. 14/065,334.
U.S. Final Office Action dated Nov. 14, 2014 issued in U.S. Appl. No. 14/065,334.
U.S. Notice of Allowance dated Feb. 17, 2015 issued in U.S. Appl. No. 14/065,334.
U.S. Notice of Allowance dated Feb. 8, 2017 issued in U.S. Appl. No. 14/713,639.
Chinese First Office Action dated Nov. 8, 2017 issued in Application No. CN 201510615853.0.
PCT Invitation to Pay Additional Fees; Communication Re Partial International Search, dated Dec. 16, 2011, issued in Application No. PCT/US2011/032303.
PCT International Search Report and Written Opinion, dated Feb. 20, 2012, issued in Application No. PCT/US2011/032303.
PCT International Preliminary Report on Patentability and Written Opinion, dated Oct. 26, 2012, issued in Application No. PCT/US2011/032303.
Chinese First Office Action dated May 19, 2016 issued in Application No. CN 201310021460.8.
Chinese Second Office Action dated Apr. 13, 2017 issued in Application No. CN 201310021460.8.
Chinese Third Office Action dated Oct. 17, 2017 issued in Application No. CN 201310021460.8.
European Extended Search Report dated Apr. 14, 2014 issued in Application No. EP 13 152 046.2.
European Examination Report dated Dec. 11, 2017 issued in Application No. EP 13 15 2046.
Japanese Office Action dated Jan. 10, 2017 issued in Application No. JP 2013-007612.
Korean Notice of Provisional Rejection dated Dec. 6, 2013 issued in Application No. KR 10-2012-0043797.
Korean Final Office Action dated Aug. 18, 2014 issued in Application No. KR 10-2012-0043797.
Korean Decision from the Patent Tribunal of the KIPO [description] dated May 26, 2015 issued in Application No. KR 10-2012-0043797.
Taiwan Examination Report dated Mar. 29, 2017 issued in Application No. TW 102102054.
PCT International Search Report and Written Opinion dated Feb. 13, 2018 issued in Application No. PCT/US2017/060692.
Becker, F.S. and Rohl, S. (Nov. 1987) "Low Pressure Deposition of Doped $SiO_2$ by Pyrolysis of Tetraethylorthosilicate (TEOS)," *J. Electrochem. Soc.: Solid-State Science and Technology*, 134(11):2923-2931.
Cecchi et al., (2007) "Ultra-thin conformal pore-sealing of low-k materials by plasma-assisted ALD," *University of New Mexico, Albuquerque, NM, Sandia National Labs*, Albuquerque, NM, 1 page.

(56) References Cited

OTHER PUBLICATIONS

Huang et al. (2017) "Design of efficient mono-aminosilane precursors for atomic layer deposition of $SiO_2$ thin films," *Royal Society of Chemistry Adv. 2017*, 7:222672-22678.
King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Kunnen et al., (2015) "A way to integrate multiple block layers for middle of line contact patterning," *Proc. of SPIE*, 9428:94280W1-8 [Downloaded on Jun. 27, 2017 from http://proceedings.spiedigitallibrary.org].
Plasma Enhanced Atomic Layer Deposition (PEALD), Website: http://www.asm.com/index.php?option=com_content&task=view&id=19&Itemid=16 1 (2010), 1 page.
"PlasmaPro™ NGP®80 Range," *Oxford Instruments* (2010), 8 pages.
U.S. Appl. No. 15/201,221, filed Jul. 1, 2016, Kumar et al.
U.S. Appl. No. 15/253,301, filed Aug. 31, 2016, Ou et al.
U.S. Appl. No. 15/253,546, filed Aug. 31, 2016, Mahorowala et al.
U.S. Appl. No. 15/279,312, filed Sep. 28, 2016, Swaminathan et al.
U.S. Appl. No. 15/349,746, filed Nov. 11, 2016, LaVoie.
U.S. Appl. No. 15/351,221, filed Nov. 14, 2016, Baldasseroni et al.
U.S. Appl. No. 15/703,917, filed Sep. 13, 2017, Abel et al.
U.S. Appl. No. 15/829,702, filed Dec. 1, 2017, Hausmann.
U.S. Appl. No. 15/847,744, filed Dec. 19, 2017, Henri et al.
U.S. Office Action dated Oct. 6, 2017 issued in U.S. Appl. No. 15/253,546.
U.S. Office Action dated Jun. 29, 2017 issued in U.S. Appl. No. 15/279,312.
U.S. Office Action dated Jul. 14, 2017 issued in U.S. Appl. No. 15/349,746.
U.S. Final Office Action dated Jan. 18, 2018 issued in U.S. Appl. No. 15/349,746.
Preliminary Amendment filed on Feb. 1, 2018 in U.S. Appl. No. 15/847,744.
Preliminary Amendment filed on Feb. 1, 2018 in U.S. Appl. No. 15/829,702.
U.S. Office Action dated Jul. 5, 2017 issued in U.S. Appl. No. 15/351,221.
U.S. Final Office Action dated Jan. 2, 2018 issued in U.S. Appl. No. 15/351,221.
U.S. Notice of Allowance dated Apr. 25, 2018 issued in U.S. Appl. No. 15/253,546.
U.S. Final Office Action dated Apr. 9, 2018 issued in U.S. Appl. No. 15/279,312.
U.S. Notice of Allowance dated Jul. 16, 2018 issued in U.S. Appl. No. 15/351,221.
U.S. Office Action dated Jun. 29, 2018 issued in U.S. Appl. No. 15/349,746.
Chinese Fourth Office Action dated May 16, 2018 issued in Application No. CN 201310021460.8.
Japanese Second Office Action [Decision of Rejection] dated Jan. 9, 2018 issued in Application No. JP 2013-007612.
PCT International Search Report and Written Opinion dated Feb. 21, 2018 issued in Application No. PCT/US2017/060240.
Chinese First Office Action dated Mar. 30, 2018 issued in Application No. CN 201610206201.6.
U.S. Office Action dated Jul. 18, 2018 issued in U.S. Appl. No. 15/703,917.
U.S. Final Office Action dated Dec. 21, 2018 issued in U.S. Appl. No. 15/349,746.
U.S. Notice of Allowance dated Dec. 5, 2018 issued in U.S. Appl. No. 15/703,917.
Taiwan First Office Action dated Feb. 27, 2019, issued in Application No. TW 106124691.
PCT International Search Report and Written Opinion dated Feb. 25, 2019 issued in Application No. PCT/US2018/050049.
Chinese Second Office Action dated Jan. 24, 2019 issued in Application No. CN 201610206201.6.
U.S. Notice of Allowance dated Jul. 26, 2018 issued in U.S. Appl. No. 15/829,702.
U.S. Notice of Allowance dated Aug. 15, 2018 issued in U.S. Appl. No. 15/279,310.
U.S. Appl. No. 16/294,783, filed Mar. 6, 2019, Abel et al.
U.S. Appl. No. 16/112,503, filed Aug. 24, 2018, Sims et al.
U.S. Appl. No. 16/179,809, filed Nov. 2, 2018, Schravendijk et al.

\* cited by examiner

METHOD FOR REDUCING THE WET ETCH RATE OF A SiN FILM WITHOUT DAMAGING THE UNDERLYING SUBSTRATE

BACKGROUND

Semiconductor device fabrication may involve deposition of silicon nitride films. Silicon nitride thin films have unique physical, chemical, and mechanical properties and thus are used in a variety of applications. For example, silicon nitride films may be used in diffusion barriers, gate insulators, sidewall spacers, encapsulation layers, strained films in transistors, and the like. Conventional methods of depositing silicon nitride films may damage components of the process chamber where deposition is performed, or may damage substrate materials.

SUMMARY

Provided herein are methods of processing substrates. One aspect involves a method of processing a substrate, the method including: (a) providing the substrate to a chamber; (b) depositing a conformal silicon nitride film over the substrate at a first temperature by: (i) exposing the substrate to a chlorine-free silicon precursor under conditions allowing the chlorine-free silicon precursor to adsorb onto the surface of the substrate, thereby forming an adsorbed layer of the chlorine free silicon precursor, and (ii) exposing the adsorbed layer of the chlorine-free silicon precursor to a nitrogen-containing reactant to form a silicon nitride film over the substrate using a plasma-free thermal reaction; and (c) treating the silicon nitride film by exposing the silicon nitride film to a treatment gas and igniting a plasma at a second temperature less than 100° C. to form a treated silicon nitride film.

In various embodiments, the first temperature is between 100° C. and 250° C. In various embodiments, the second temperature is between 25° C. and 100° C. In some embodiments, the second temperature is between 50° C. and 100° C.

In various embodiments, the wet etch rate of the treated silicon nitride film in 100:1 hydrofluoric acid is less than about 30 Å/minute.

In some embodiments, treating the silicon nitride film reduces the wet etch rate of the silicon nitride film in 100:1 hydrofluoric acid by at least 90%.

In various embodiments, the treatment gas is nitrogen and/or helium.

The method can also include repeating (i) and (ii) in deposition cycles to deposit the conformal silicon nitride film. In various embodiments, (b) is performed after every deposition cycle. In some embodiments, (b) is performed every n deposition cycles of repeating (i) and (ii) in (a), and n is an integer greater than 2.

In various embodiments, the treated silicon nitride film has less than 5% hydrogen in atomic content. In some embodiments, the conformal silicon nitride film is deposited to a thickness less than about 50 Å.

The silicon nitride film may be deposited over a memory stack including germanium, antimony, and tellurium. In some embodiments, the silicon nitride film is deposited over one or more exposed layers of chalcogenide material.

In various embodiments, the treated silicon nitride film has a density of at least about 2.4 g/cc. In some embodiments, treating the silicon nitride film reduces the N—H content of the silicon nitride film as measured by FTIR.

In some embodiments, the silicon nitride film is exposed to the plasma for a duration between about 1 second and about 10 seconds. In various embodiments, the chlorine-free silicon precursor may be any one or more of iodine-containing silicon precursors, bromine containing silicon precursors, and iodine-and-bromine-containing silicon precursors.

In some embodiments, the chlorine-free silicon precursor is one or more of compounds having a chemical formula of $Si_xBr_yI_z$, where x=1, y is an integer between and including 1 and 4, and y+z=4; and compounds having a chemical formula of $Si_xBr_yI_z$, where x=2, y is an integer between and including 1 and 6, and y+z=6.

The chlorine-free silicon precursor may be any of tetrabromosilane ($SiBr_4$), $SiBr_3I$, $SiBr_2I_2$, $SiBrI_3$, hexabromodisilane ($Si_2Br_6$), $Si_2Br_5I$, $Si_2Br_4I_2$, $Si_2Br_3I_3$, $Si_2Br_2I_4$, $Si_2BrI_5$, and combinations thereof.

Another aspect involves a method of processing a substrate, the method including: (a) providing the substrate to a chamber; (b) depositing a conformal silicon nitride film over the substrate at a first temperature by: (i) exposing the substrate to alternating pulses of a chlorine-free silicon precursor and a nitrogen-containing reactant to form a silicon nitride film over the substrate using a plasma-free thermal reaction; and (c) treating the silicon nitride film by exposing the silicon nitride film to a treatment gas and igniting a plasma at a second temperature less than 100° C. to form a treated silicon nitride film.

Another aspect involves an apparatus for patterning substrates, the apparatus including: one or more process chambers; one or more gas inlets into the one or more process chambers and associated flow control hardware; a low frequency radio frequency (LFRF) generator; a high frequency radio frequency (HFRF) generator; and a controller having at least one processor and a memory, whereby the at least one processor and the memory are communicatively connected with one another, the at least one processor is at least operatively connected with the flow-control hardware, the LFRF generator, and the HFRF generator, and the memory stores computer-executable instructions for controlling the at least one processor to at least control the flow-control hardware, the HFRF generator, and the LFRF generator to: depositing a conformal silicon nitride film over the substrate at a first temperature by: introducing a chlorine-free silicon precursor under conditions allowing the chlorine-free silicon precursor to adsorb onto a surface of a substrate, thereby forming an adsorbed layer of the chlorine free silicon precursor, and introducing a nitrogen-containing reactant to form a silicon nitride film over the substrate using a plasma-free thermal reaction; and (c) treating the silicon nitride film by exposing the silicon nitride film to a treatment gas and igniting a plasma at a second temperature less than 100° C. to form a treated silicon nitride film.

These and other aspects are described further below with reference to the drawings.

DETAILED DESCRIPTION

Figure 1:
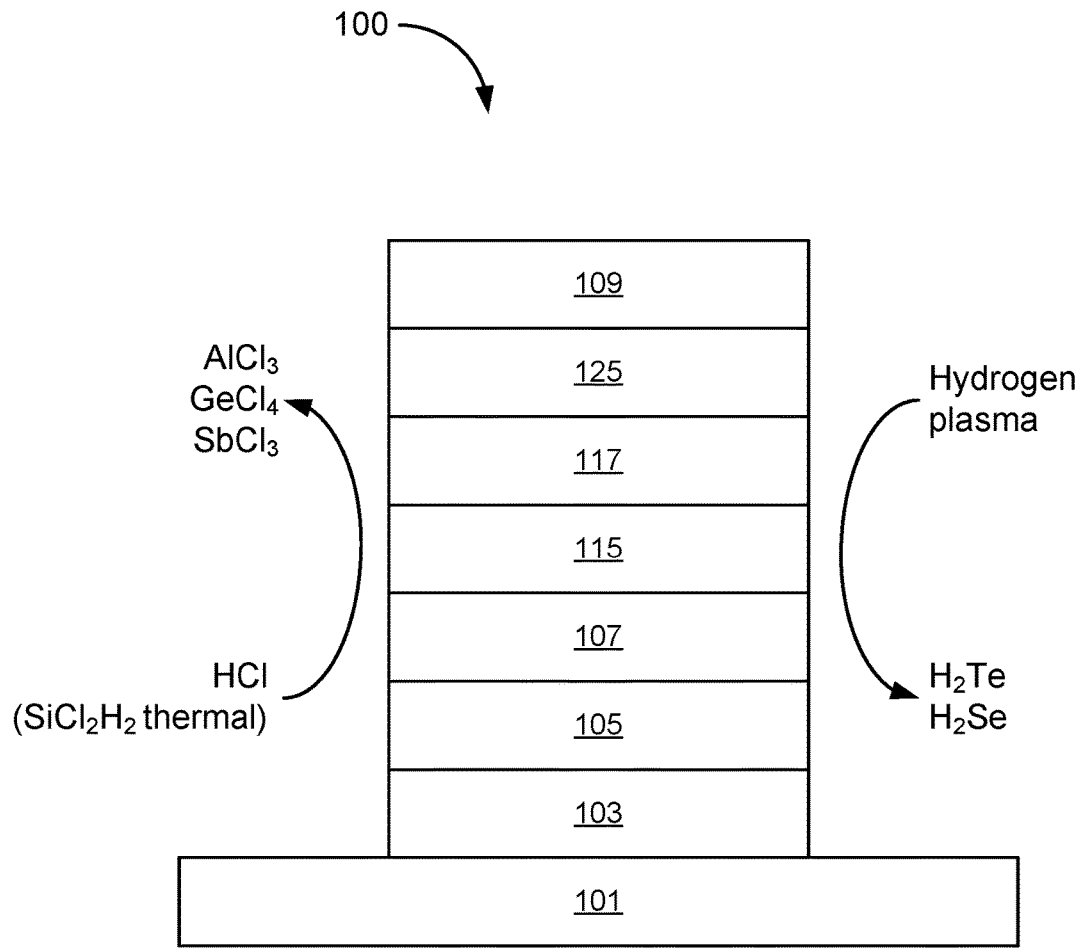
FIG. 1 is a schematic illustration of an example substrate.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes often involve deposition of silicon nitride material. In one example, silicon nitride may be used in semiconductor device fabrication as diffusion barriers, gate insulators, sidewall spacers, and encapsulation layers. Conformal silicon nitride layers may also be used in other applications. For example, silicon nitride may be used during fabrication of memory structures. Silicon nitride is used as an encapsulation layer over memory devices. Conventional memory structures include metal oxide materials used for bit storage. However, as advanced memory structures are developed to accommodate smaller device sizes and improve efficiency, new challenges arise. Advanced memory architectures such as magnetoresistive random-access memory and phase change random-access memory (PCRAM) rely on new materials (other than metal oxides) for bit storage. In the case of PCRAM for example, the phase of a metal chalcogenide determines the bit state. Some example chalcogenides include sulfur (S), selenium (Se), and tellurium (Te). These new materials are air and moisture sensitive and may require encapsulation layers. When combined with appropriate metalloid ions such as germanium (Ge), antimony (Sb), etc., these chalcogenides form a phase change layer. One example of a phase change layer includes germanium, antimony, and tellurium (which may be referred to as a "GST layer" as used herein). If damaged, the phase change layer may not change phases. The phase change layer may also be sensitive to light. To prevent damage to the phase change layer, a conformal silicon nitride memory encapsulation layer is deposited over the phase change layer. It is desirable for a silicon nitride encapsulation layer to have various characteristics: conformal deposition, low wet etch rate, and low or no hydrogen content. Deposition and treatment operations over the memory device are performed at low temperatures to reduce damage to the underlying material.

However, many conventional deposition methods for depositing such silicon nitride layers as encapsulations layers for magnetic devices either deposit non-conformal films, such as in plasma enhanced chemical vapor deposition (PECVD), or use chemistries that etch the chalcogenide material, such as chlorine-containing or hydrogen-containing plasmas. For example, the metal may undergo erosion as follows:

$$M_{(solid)} + xCl_{(gas)} \rightarrow MCl_{x(gas)} \qquad \text{Eqn. 1}$$

In another example, the metal may undergo oxidation or nitridation. An example of an oxidation reaction may be as follows:

$$M_{(solid)} + xO_{(gas)} \rightarrow MO_{x(solid)} \qquad \text{Eqn. 2}$$

Use of a chlorine-containing silicon precursor also often involves deposition at extremely high temperatures, such as at temperatures higher than about 500° C. Deposition processes at such high temperatures are usually not feasible for memory devices, as the underlayers may be damaged from the heat. For example, the highest temperature for depositing films over a GST layer may be about 250° C. to avoid damage to the GST layer due to heat. As a result, deposition using chlorine-containing precursors has conventionally involved igniting a plasma to catalyze the reaction to form silicon nitride. For example, some conventional deposition involves alternating doses of dichlorosilane (or another chlorine-containing precursor) and ammonia ($NH_3$) plasma, but both of these operations tend to generate species capable of etching chalcogenide material. Igniting plasma after adsorbing a layer of dichlorosilane ($SiCl_2H_2$) to form silicon nitride by plasma enhanced atomic layer deposition results in formation of hydrogen radicals and $NH_2$ radicals as well as hydrogen chloride, which may then attack metal chalcogenides and metal components of the chamber. An example is provided in FIG. 1.

FIG. 1 depicts a substrate 100 including an oxide layer 101. The substrate 100 also includes a tungsten layer 103, carbon layer 105, chalcogenide layer 107, second carbon layer 115, second chalcogenide layer 117, third carbon layer 125, and nitride layer 109.

As shown in FIG. 1, if a chlorine-containing silicon precursor is used to deposit an encapsulation layer over the substrate, chlorine and/or hydrogen radicals generated when the plasma is ignited with the second reactant may react to form hydrogen chloride such that chlorine may react with aluminum, germanium, or antimony, or other chamber material metals including iron or copper. These materials (e.g., $AlCl_3$, $GeCl_4$, or $SbCl_3$) may generate an evaporative layer, which form volatile metal salts. These materials have a low boiling point; for example, the boiling point of $AlCl_3$ is 120° C., the boiling point of $GeCl_4$ is 87° C., and the boiling point of $SbCl_3$ is 200° C. These volatile metal salts may thereby redeposit onto other layers of the substrate resulting in defects and performance issues. Thus, chlorine precursors suffer from the general issues of metal contamination in the films due to chamber etching which produces volatile metal chlorides (Al, Fe, and Cu).

Similarly, a plasma generated from a nitrogen-containing reactant such as ammonia may form free hydrogen ions, radicals, and other plasma species that may also etch the chalcogenide. For example, a hydrogen plasma may react with tellurium or selenium to form $H_2Te$ and $H_2Se$ respectively, thereby removing material from the stack and resulting in performance issues and defects. These materials have a low boiling point; for example, $H_2Te$ has a boiling point of −2° C., and $H_2Se$ has a boiling point of −41° C. Generation of such material from exposure to hydrogen plasma may thereby etch the stack. Accordingly, conventional chlorine- and hydrogen-free processes (e.g. using an $N_2$ plasma) do not generate a conformal film and are not effective as barriers.

A chlorine-free silicon precursor may be used for depositing a conformal silicon nitride film using a thermal atomic layer deposition (ALD) process over memory devices. Discussion on using such precursors in silicon nitride deposition by ALD are further described in U.S. patent application Ser. No. 14/935,317, filed on Nov. 6, 2015 and titled "METHOD FOR ENCAPSULATING A CHALCOGENIDE MATERIAL" and U.S. patent application Ser. No. 15/272,222, filed on Sep. 21, 2016 and titled "BROMINE CONTAIN- ING SILICON PRECURSORS FOR ENCAPSULATION LAYERS", which are herein incorporated by reference in their entireties.

While these precursors are used to deposit silicon nitride without damaging the underlying substrate, the resulting silicon nitride film still has a high wet etch rate, which affects subsequent processing. It is desirable to have a low wet etch rate silicon nitride material to sufficiently encapsulate the underlying device when the substrate is exposed to various chemicals in subsequent processing. For example, the film may be exposed to chemistries for performing chemical mechanical planarization. However, techniques for lowering the wet etch rate of the silicon nitride film are lacking. For example, one technique is to plasma-treat the silicon nitride using nitrogen to reduce the wet etch rate after depositing the silicon nitride such that plasma treatment and deposition are performed at the same temperature of about 250° C. Temperature is maximized to the highest temperature the substrate can allow (e.g., 250° C.) to reduce the hydrogen content in the film. However, such treatment damages the underlying material, such as a GST layer that may be on a PCRAM device because the nitrogen plasma reacts with germanium to form germanium nitride (GeN) on the surface. Germanium nitride formation results in a crust over the material, thereby affecting device performance.

Provided herein are methods and apparatuses for forming conformal silicon nitride over a memory device such that the formed silicon nitride film has reduced wet etch rate without damaging the underlying substrate. Methods are particularly applicable to encapsulation of PCRAM devices, especially devices where the phase change layer is a GST layer. Methods involve forming a silicon nitride layer using a chlorine-free silicon precursor and treating the silicon nitride layer using a hydrogen-free plasma at low temperatures, such as less than about 100° C. The improvement in wet etch rate reduction is surprising and counter-intuitive, as it is usually expected for wet etch rate to increase at lower temperatures (hence conventional techniques of performing deposition and any treatment at the maximum temperature allowable by the underlying substrate without damaging it). Instead, disclosed embodiments involve using low temperatures to improve wet etch rate performance.

Figure 2:
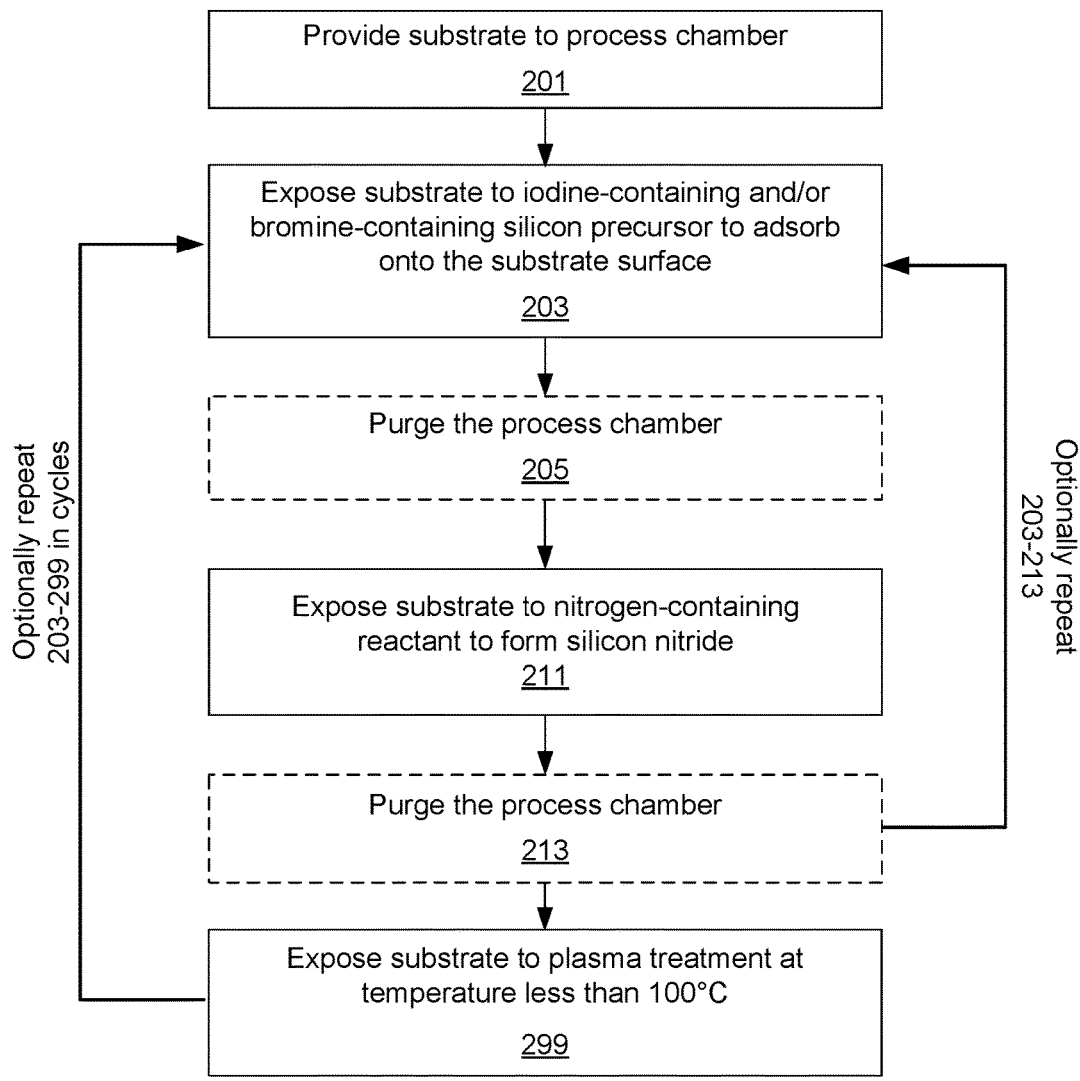
FIG. 2 is a process flow diagram depicting operations for a method in accordance with disclosed embodiments.

FIG. 2 provides a process flow diagram of operations that are performed in accordance with certain disclosed embodiments. In operation 201, a substrate is provided to a process chamber. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Non-limiting examples of underlayers include dielectric layers and conducting layers, e.g., silicon oxides, silicon nitrides, silicon carbides, metal oxides, metal nitrides, metal carbides, and metal layers. In some embodiments, the substrate includes a stack such as the one depicted in FIG. 1. In some embodiments, the substrate includes two or more stacks, each of the stacks including layers such as the layers depicted in FIG. 1. The space between stacks may be narrow such that aspect ratios between stacks may be between about 3:1 and about 10:1, such as about 5:1.

During operations 203-213 of FIG. 2A, an inert gas may be flowed. In various embodiments, the inert gas is used as a carrier gas. Example carrier gases include argon, helium, and neon. In some embodiments, a hydrogen-containing carrier gas may be used. In some embodiments, the carrier gas is used as a purge gas in some operations. In some embodiments, the carrier gas is diverted. The inert gas may be provided to assist with pressure and/or temperature control of the process chamber, evaporation of a liquid reactant, more rapid delivery of the reactant and/or as a sweep gas for removing process gases from the process chamber and/or process chamber plumbing. Various disclosed embodiments may be performed at a pressure between about 0.1 Torr and about 20 Torr. Operations 203-213 may be performed at a substrate temperature less than about 300° C., such as between about 50° C. and about 300° C., for example, about 250° C. In such embodiments, the pedestal may be set to a temperature of less than about 300° C. to control the substrate temperature. For example, for MRAM and PCRAM applications, the materials on the substrate may be sensitive to high temperatures. In some embodiments, silicon nitride is deposited at a temperature between about 200° C. and about 275° C.

In operation 203, the substrate is exposed to an iodine-containing and/or bromine-containing silicon precursor such that the iodine-containing and/or bromine-containing silicon precursor adsorbs onto the substrate surface. Iodine-containing and/or bromine-containing silicon precursors may be completely substituted with bromine and/or iodine atoms in various embodiments. That is, iodine-containing precursors and/or bromine-containing precursors may have no hydrogen atoms. Disclosed embodiments involve precursors not conventionally used for deposition of silicon nitride by ALD. Using an iodine-containing and/or bromine-containing silicon precursor allows for chlorine-free deposition. Example iodine-containing silicon precursors include diiodosilane (DIS), tetraiodosilane, hexaiododisilane, and others. In various embodiments, bromine-containing silicon precursors are fully halogenated. Bromine-containing silicon precursors may have the chemical formula $Si_xBr_yI_z$, where if x=1, y is an integer between and including 1 and 4, and y+z=4, or where if x=2, y is an integer between and including 1 and 6, and y+z=6. Example bromine-containing silicon precursors include tetrabromosilane ($SiBr_4$), $SiBr_3I$, $SiBr_2I_2$, $SiBrI_3$, hexabromodisilane ($Si_2Br_6$), $Si_2Br_5I$, $Si_2Br_4I_2$, $Si_2Br_3I_3$, $Si_2Br_2I_4$, $Si_2BrI_5$, and combinations thereof.

Operation 203 may be part of an ALD cycle. As discussed above, generally an ALD cycle is the minimum set of operations used to perform a surface deposition reaction one time. In some embodiments, the result of one cycle is production of at least a partial silicon nitride film layer on a substrate surface. The cycle may include certain ancillary operations such as sweeping one of the reactants or byproducts and/or treating the partial film as deposited. Generally, a cycle contains one instance of a unique sequence of operations. As discussed above, generally a cycle is the minimum set of operations used to perform a surface deposition reaction one time. The result of one cycle is production of at least a partial film layer, e.g., a partial silicon nitride film layer, on a substrate surface.

During operation 203, the substrate is exposed to a silicon-containing precursor such that the silicon-containing precursor is adsorbed onto the substrate surface to form an adsorbed layer. In some embodiments, an iodine-containing and/or bromine-containing silicon precursor adsorbs onto the substrate surface in a self-limiting manner such that once active sites are occupied by the iodine-containing and/or bromine-containing silicon precursor, little or no additional iodine-containing and/or bromine-containing silicon precursor will be adsorbed on the substrate surface. For example, iodine-containing and/or bromine-containing silicon precursor may be adsorbed onto about 60% of the substrate surface. In various embodiments, when the iodine-containing and/or bromine-containing silicon precursor is flowed to the chamber, the iodine-containing and/or bromine-containing silicon precursor adsorbs onto active sites on the surface of the substrate, forming a thin layer of the iodine-containing and/or bromine-containing silicon precursor on the surface. In various embodiments, this layer may be less than a monolayer, and may have a thickness between about 0.2 Å and about 0.4 Å. Methods provided herein may be performed at a temperature less than about 300° C., such as at about 250° C. In some embodiments, disclosed embodiments are performed at a temperature between about 50° C. and about 300° C., such as at a temperature between about 200° C. and about 275° C. In some embodiments, silicon nitride is deposited at a temperature between about 50° C. and about 300° C. In some embodiments, silicon nitride is deposited at a temperature between about 200° C. and about 275° C.

In operation 205, the process chamber is optionally purged to remove excess iodine-containing silicon precursor in gas phase that did not adsorb onto the surface of the substrate. Purging the chamber may involve flowing a purge gas or a sweep gas, which may be a carrier gas used in other operations or may be a different gas. In some embodiments, purging may involve evacuating the chamber. Example purge gases include argon, nitrogen, hydrogen, and helium. In some embodiments, operation 205 may include one or more evacuation subphases for evacuating the process chamber. Alternatively, it will be appreciated that operation 205 may be omitted in some embodiments. Operation 205 may have any suitable duration, such as between about 0 seconds and about 60 seconds, for example about 0.01 seconds. In some embodiments, increasing a flow rate of one or more purge gases may decrease the duration of operation 205. For example, a purge gas flow rate may be adjusted according to various reactant thermodynamic characteristics and/or geometric characteristics of the process chamber and/or process chamber plumbing for modifying the duration of operation 205. In one non-limiting example, the duration of a purge phase may be adjusted by modulating purge gas flow rate. This may reduce deposition cycle time, which may improve substrate throughput. After a purge, the iodine-containing and/or bromine-containing silicon precursors remain adsorbed onto the substrate surface.

In operation 211, the substrate is exposed to a second reactant to react with the adsorbed layer of the iodine-containing and/or bromine-containing silicon precursor. Note that the term "second reactant" may be used to describe one or more gases introduced to the chamber when plasma is ignited in an ALD cycle. In various embodiments, the second reactant is a nitrogen-containing reactant. In some embodiments, operation 203 may be performed before performing operation 211. In some embodiments, operation 211 may be performed before performing operation 203. In some embodiments, operation 211 may be performed before depositing any silicon nitride.

In some embodiments, the reaction may be thermal. Methods involving thermal ALD using either ammonia ($NH_3$) or hydrazines (e.g., $H_4N_2$) reduce contamination and reduce the presence of hydrogen radicals during deposition, thereby reducing etching of the chalcogenide and/or metals on the substrate and/or in the chamber. For a thermal process, deposition may be performed at a temperature of at least about 250° C., such as about 300° C. In some embodiments, disclosed embodiments are performed at a temperature between about 50° C. and about 300° C., such as at a temperature between about 200° C. and about 275° C. In some embodiments, silicon nitride is deposited at a temperature between about 50° C. and about 300° C. In some embodiments, silicon nitride is deposited at a temperature between about 200° C. and about 275° C.

In some embodiments, a plasma may be optionally ignited in operation 211. Plasma energy may be provided to activate the second reactant, such as a nitrogen-containing gas, into ions and radicals and other activated species, which react with the adsorbed layer of the first precursor. In disclosed embodiments involving a plasma, the plasma may include less than about 1% hydrogen radicals, thereby reducing etching of chalcogenide or metal material during deposition. In various embodiments, the plasma is an in-situ plasma, such that the plasma is formed directly above the substrate surface in the chamber. The in-situ plasma may be ignited at a power per substrate area between about 0.2122 $W/cm^2$ and about 2.122 $W/cm^2$. For example, the power may range from about 150 W to about 6000 W, or from about 600 W to about 6000 W, or from about 800 W to about 4000 W, for a chamber processing four 300 mm wafers. For example, plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. In various embodiments, a high frequency plasma is used having a frequency of at least about 13.56 MHz, or at least about 27 MHz, or at least about 40 MHz, or at least about 60 MHz. In some embodiments, a microwave-based plasma may be used. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that a second reactant is ignited in a remote plasma generator upstream of the chamber, then delivered to the chamber where the substrate is housed.

Where a plasma is used, a dose of an iodine-containing silicon precursor may be followed by a dose of nitrogen ($N_2$) or hydrogen ($H_2$) plasma. The corresponding iodine-containing and/or bromine-containing metal salts that may generate from reacting with chalcogenides on the substrate or metals of the chamber components may not be sufficiently volatile to result in wafer contamination. For example, iodine-containing salts including aluminum, germanium, or antimony have higher boiling points than corresponding chlorine-containing salts. As a result, iodine-containing salts may form a passivation layer, but not an evaporative layer, and the salts are less likely to redeposit onto materials on the substrate. In some cases, aluminum may react with chlorine such that the chamber is etched and therefore damaged, and aluminum may also decompose onto the wafer.

Returning to FIG. 2A, in operation 213, the chamber is optionally purged to remove the etched species and any residual byproducts. Operation 213 may be purged using any of the conditions described above with respect to operation 205.

After performing operation 213, it is determined whether the desired thickness of film has been deposited. If not, operations 203-213 are repeated in sufficient cycles to deposit a desired thickness of film. Any suitable number of deposition cycles may be included in an ALD process to deposit a desired film thickness of silicon nitride. For example, about fifty deposition cycles may be performed to deposit a film on the substrate using disclosed embodiments. In some embodiments the thickness of the deposited silicon nitride film may be greater than about 30 Å on a sidewall over a stack of films for fabrication of a memory device.

In operation 299, the substrate is exposed to a plasma treatment at a substrate temperature less than about 100° C. A treatment gas is flowed and a plasma is ignited. The treatment gas may be nitrogen and/or helium. In various embodiments, operation 299 involves changing the substrate temperature by adjusting the temperature to which the pedestal holding the substrate is set. In some embodiments, the plasma treatment is performed at a substrate temperature between about 25° C. and about 100° C., or between about 50° C. and about 100° C. The substrate is exposed to the treatment plasma after every n cycles of performing operations 203-213, where n is any integer of 1 or greater. In some embodiments, the treatment is performed after all cycles of operations 203-213 over a formed silicon nitride film.

Treating the deposited silicon nitride film with a nitrogen and/or helium plasma at a higher temperature such as about 250° C. results in nitridation of the underlayers, such as a GST layer, and formation of a germanium nitride crust, which affects device performance. Although deposition and treatment temperatures are generally selected to be as high as possible to minimize the hydrogen content of the silicon nitride film and reduce the wet etch rate, treatment performed at low temperatures of less than about 100° C. as described herein with respect to certain disclosed embodiments yields surprisingly low wet etch rate silicon nitride films. Treatments at lower temperatures as described herein are not expected to substantially affect the wet etch rate. However, wet etch rate of the treated silicon nitride film is surprisingly substantially reduced when treatment is performed at temperatures less than about 100° C. Treating silicon nitride films reduces the wet etch rate by at least 90%. Disclosed embodiments result in treated silicon nitride films having a wet etch rate in 100:1 dilute hydrofluoric acid of less than about 30 Å/minute. Additionally, plasma treatment eliminates formation of the germanium nitride crust, and reduces the hydrogen content of the film, which may be incorporated from silicon precursors or reactants used for depositing the silicon nitride film. Untreated films may have a hydrogen content of about 20% or more in atomic content. In contrast, films treated using certain disclosed embodiments as described herein have a hydrogen content of less than about 5% in atomic content. Untreated films may also have a lower density, such as between about 2.0 g/cc and about 2.2 g/cc. In various embodiments, film treated in accordance with certain disclosed embodiments may have a density of at least about 2.4 g/cc.

Operation 299 involves setting the temperature of the pedestal holding the substrate to a temperature less than about 100° C., introducing a nitrogen or helium gas to the chamber, and igniting a plasma. In various embodiments, the plasma does not contain hydrogen, as a hydrogen-containing plasma will etch underlying material, such as a GST layer. The plasma in some embodiments is an in-situ plasma, such that the plasma is formed directly above the substrate surface in the chamber. The in-situ plasma may be ignited at a power per substrate area between about 0.10 W/cm² and about 2.0 W/cm². For example, the power may range from about 75 W to about 1500 W; or from about 300 W to about 6000 W for a chamber processing four 300 mm wafers. For example, plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase molecules. Collision of these electrons with molecules may form radical species that participate in the treatment process. It will be appreciated that the RF field may be coupled via any suitable electrodes. In various embodiments, a high frequency plasma is used having a frequency of at least about 13.56 MHz, or at least about 27 MHz, or at least about 40 MHz, or at least about 60 MHz. In some embodiments, a microwave-based plasma may be used. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that nitrogen or helium is ignited in a remote plasma generator upstream of the chamber, then delivered to the chamber where the substrate is housed.

The silicon nitride film is treated for a duration between about 1 second and about 10 seconds. In some embodiments, the silicon nitride film is deposited to a thickness of about 100 Å after performing operations 203-299 in cycles.

Figure 3:
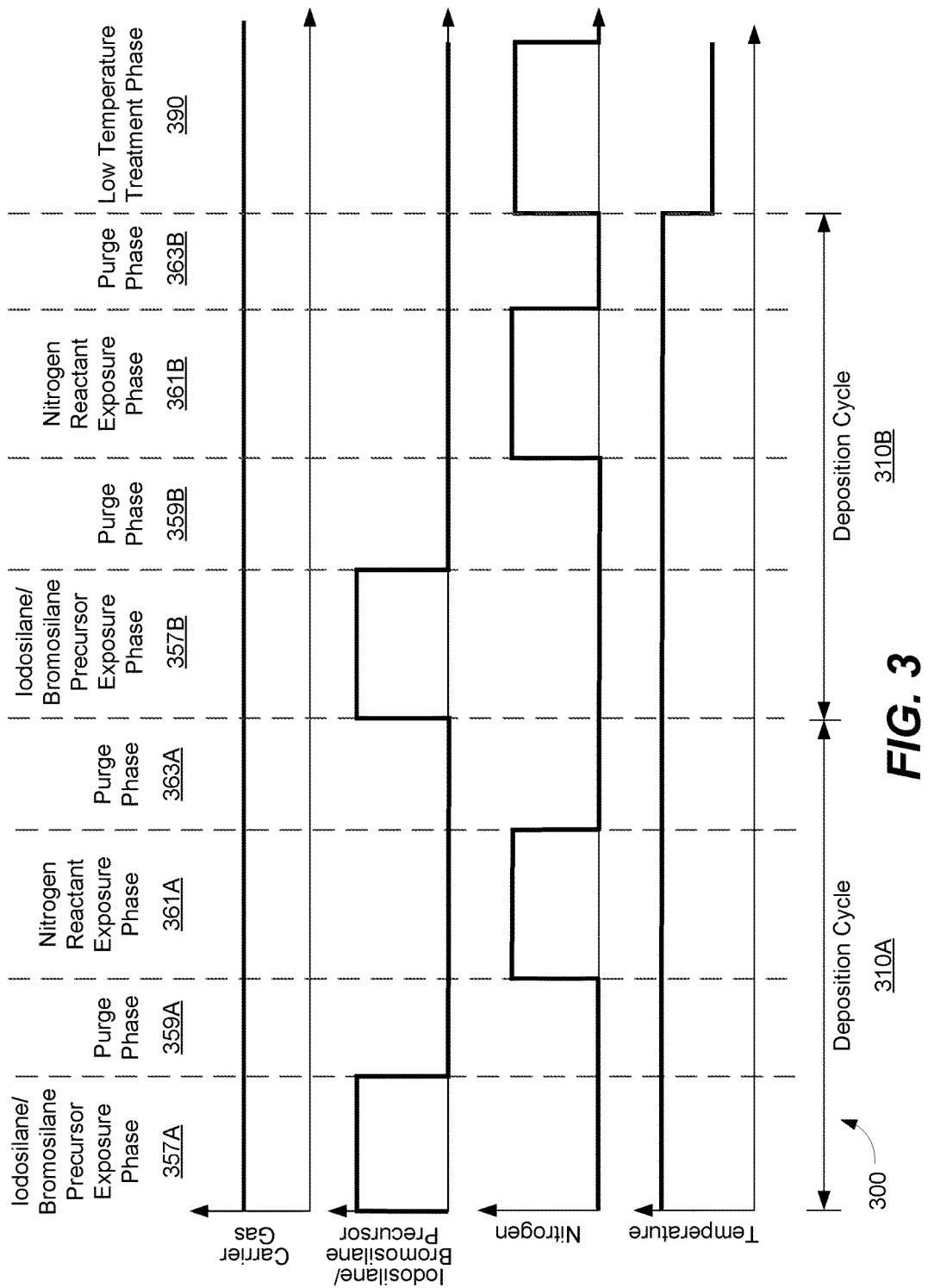
FIG. 3 is a timing sequence diagram showing an example of cycles in a method in accordance with certain disclosed embodiments.

FIG. 3 provides a timing scheme diagram for performing a low temperature treatment phase after two cycles of deposition. Note that while two cycles are depicted, any number of cycles may be performed to deposit silicon nitride. Additionally, while one treatment phase is depicted for two cycles of deposition, it will be understood that the treatment may be performed after every cycle, or after every 2 cycles, or after every 3 cycles, or after every n cycles, for any integer n greater than or equal to 1.

FIG. 3 depicts a process 300 including two deposition cycles—deposition cycle 310A and deposition 310B with a low temperature treatment phase 390 following the two deposition cycles. FIG. 3 also shows carrier gas flow, iodosilane/bromosilane precursor gas flow, nitrogen gas flow, temperature, and plasma. It will be understood that the precursor may include an iodosilane, bromosilane, or combination thereof. The example shown in FIG. 3 involves using a nitrogen plasma for the low temperature treatment phase 390, but it will be understood that in some embodiments, another non-hydrogen-containing gas such as helium may be used to ignite the plasma.

Deposition cycle 310A includes an iodosilane/bromosilane precursor exposure phase 357A, purge phase 359A, nitrogen reactant exposure phase 361A, and purge phase 363A. These operations may constitute one ALD cycle. During iodosilane/bromosilane precursor exposure phase 357A, a carrier gas may be flowed. In some embodiments, a carrier gas may be flowed with the precursor and then diverted. Iodosilane/bromosilane precursor exposure phase 357A may correspond to operation 203 of FIG. 2. During iodosilane/bromosilane precursor exposure phase 357A, the iodosilane/bromosilane precursor gas flow is turned on, nitrogen flow is turned off, and temperature is set on "high", which may be about 250° C., or the highest possible temperature for forming the silicon nitride film without damaging the substrate. In purge phase 359A, the iodosilane/bromosilane precursor flow is turned off, nitrogen flow remains off, temperature remains at 250° C., and the carrier gas may be flowed to the chamber to remove precursors that did not adsorb to the substrate. This phase may correspond to operation 205 of FIG. 2. In nitrogen reactant exposure phase 361A, the carrier gas may continue to flow and/or may be used to introduce nitrogen to the chamber. Iodosilane/ bromosilane precursor flow remains off, nitrogen gas flow is turned on and temperature remains at 250° C. It will be noted that plasma remains off during the deposition cycle to allow a thermal deposition process. Nitrogen reactant exposure phase 361A may correspond to operation 211 of FIG. 2. In purge phase 363A, a carrier gas is flowed to remove byproducts from reacting the iodosilane/bromosilane precursor with the nitrogen reactant, iodosilane/bromosilane precursor flow remains off, nitrogen gas flow is turned off, and temperature remains at 250° C. This phase may correspond to operation 213 of FIG. 2.

Following deposition cycle 310A, the ALD cycle is repeated for deposition cycle 310B, which may correspond to optionally repeating operations 203-213 of FIG. 2. As shown in FIG. 3, deposition cycle 310B includes phases mirroring those of deposition cycle 310A, as the ALD cycle is repeated to include iodosilane/bromosilane precursor exposure phase 357B, purge phase 359B, nitrogen reactant exposure phase 361B, and purge phase 363B. Following deposition cycle 310B, a low temperature treatment phase 390 is performed such that carrier gas may be flowed and/or be used to introduce nitrogen and be diverted, iodosilane/bromosilane precursor flow remains off, nitrogen flow is turned on, and temperature is reduced to a temperature less than about 100° C. Here, low temperature treatment phase 390 may correspond to operation 299 of FIG. 2. Note that although not shown in FIG. 3, deposition cycle 310A, deposition cycle 310B, and low temperature post-treatment phase 390 may be repeated in subsequent cycles until the desired thickness of a silicon nitride film having low hydrogen content and low wet etch rate is achieved.

Apparatus

Figure 4:
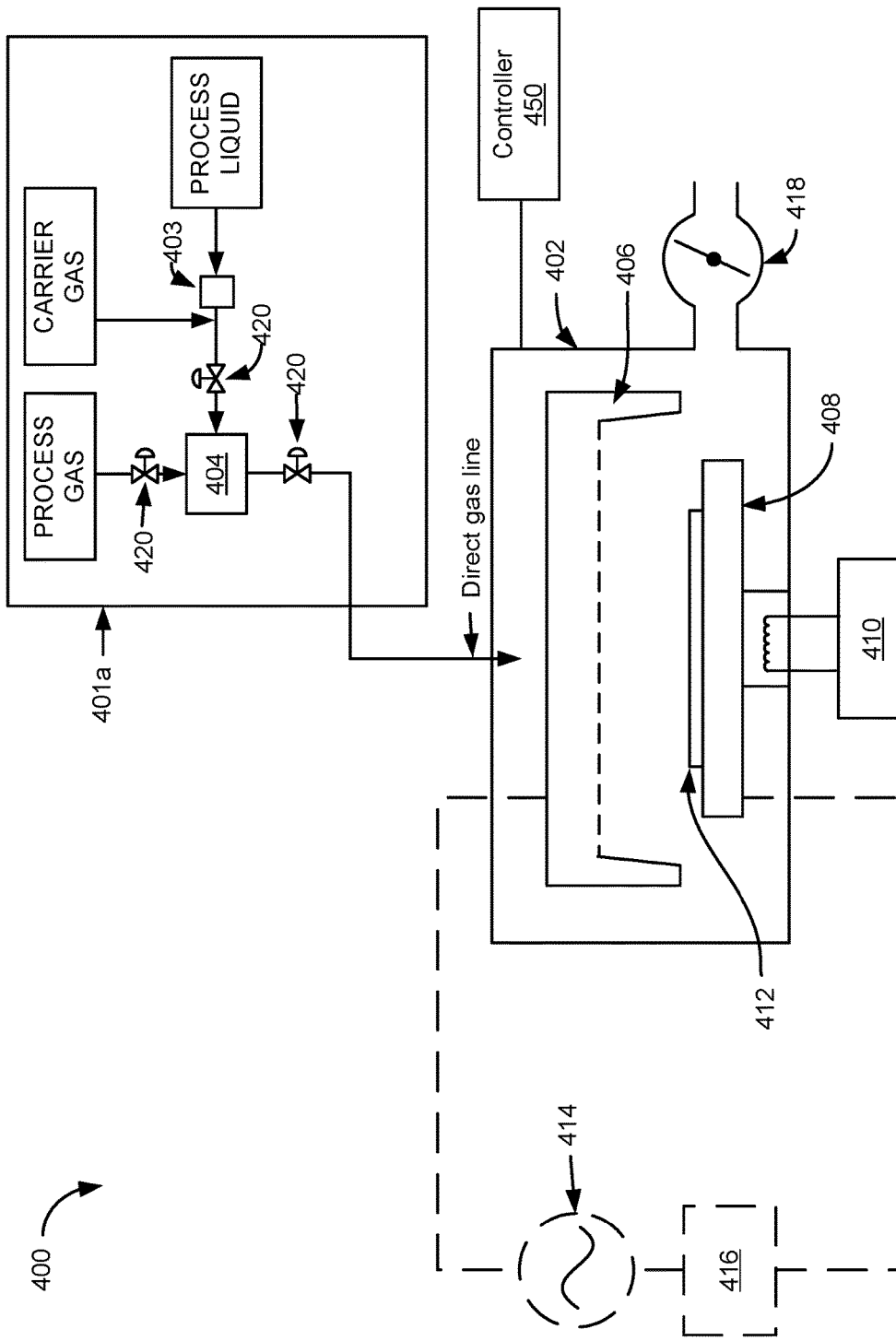
FIG. 4 is a schematic diagram of an example process chamber for performing disclosed embodiments.
Figure 5:
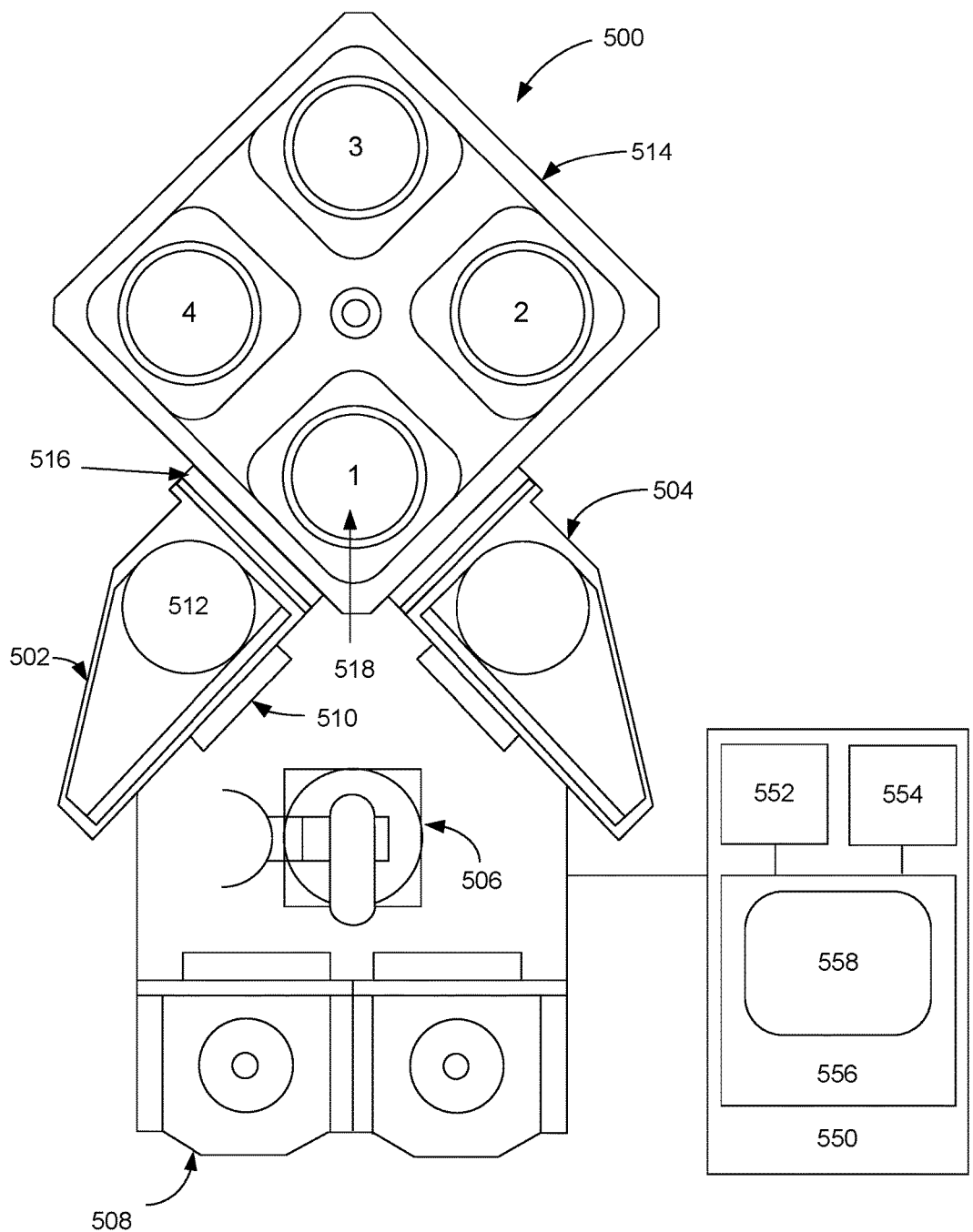
FIG. 5 is a schematic diagram of an example process tool for performing disclosed embodiments.

FIG. 4 depicts a schematic illustration of an embodiment of an atomic layer deposition (ALD) process station 400 having a process chamber body 402 for maintaining a low-pressure environment. A plurality of ALD process stations 400 may be included in a common low pressure process tool environment. For example, FIG. 5 depicts an embodiment of a multi-station processing tool 500. In some embodiments, one or more hardware parameters of ALD process station 400 including those discussed in detail below may be adjusted programmatically by one or more computer controllers 450.

ALD process station 400 fluidly communicates with reactant delivery system 401a for delivering process gases to a distribution showerhead 406. Reactant delivery system 401a includes a mixing vessel 404 for blending and/or conditioning process gases, such as an iodine-containing and/or bromine-containing silicon precursor gas, or second reactant gas (e.g., ammonia or hydrazine), for delivery to showerhead 406. One or more mixing vessel inlet valves 420 may control introduction of process gases to mixing vessel 404. Nitrogen plasma or hydrogen plasma may also be delivered to the showerhead 406 or may be generated in the ALD process station 400.

As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) upstream of vaporization point 403 may be provided for controlling a mass flow of liquid for vaporization and delivery to process station 400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 406 distributes process gases toward substrate 412. In the embodiment shown in FIG. 4, the substrate 412 is located beneath showerhead 406 and is shown resting on a pedestal 408. Showerhead 406 may have any suitable shape, and may have any suitable number and arrangement of ports for distributing process gases to substrate 412.

In some embodiments, pedestal 408 may be raised or lowered to expose substrate 412 to a volume between the substrate 412 and the showerhead 406. It will be appreciated that, in some embodiments, pedestal height may be adjusted programmatically by a suitable computer controller 450.

In another scenario, adjusting a height of pedestal 408 may allow a plasma density to be varied during plasma activation cycles in the process in embodiments where a plasma is ignited. At the conclusion of the process phase, pedestal 408 may be lowered during another substrate transfer phase to allow removal of substrate 412 from pedestal 408.

In some embodiments, pedestal 408 may be temperature controlled via heater 410. In some embodiments, the pedestal 408 may be heated to a temperature of at least about 250° C., or in some embodiments, less than about 300° C., such as about 250° C., during deposition of silicon nitride films as described in disclosed embodiments. In some embodiments, the pedestal is set at a temperature between about 50° C. and about 300° C., such as at a temperature between about 200° C. and about 275° C. In some embodiments, the pedestal is set at a temperature between about 50°

C. and about 300° C. In some embodiments, the pedestal is set at a temperature between about 200° C. and about 275° C.

Further, in some embodiments, pressure control for process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to the process station 400.

In some embodiments, a position of showerhead 406 may be adjusted relative to pedestal 408 to vary a volume between the substrate 412 and the showerhead 406. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more suitable computer controllers 450.

In some embodiments where plasma may be used as discussed above, showerhead 406 and pedestal 408 electrically communicate with a radio frequency (RF) power supply 414 and matching network 416 for powering a plasma. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of radical species. Examples of suitable powers are included above. Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as an iodine-containing and/or bromine-containing silicon precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas such as ammonia, instructions for modulating the flow rate of a carrier or purge gas, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. A fifth, subsequent recipe phase may include instructions for modulating or stopping a flow rate of an inert and/or a reactant gas, instructions for modulating a flow rate of a carrier or purge gas and time delay instructions for the fourth recipe phase, instructions for setting a flow rate of a treatment gas, reducing the pedestal temperature to a temperature less than about 100° C. and igniting a plasma. It will be appreciated that these recipe phases may be further subdivided and/or iterated in any suitable way within the scope of the disclosed embodiments. In some embodiments, the controller 450 may include any of the features described below with respect to system controller 550 of FIG. 5.

As described above, one or more process stations may be included in a multi-station processing tool. FIG. 5 shows a schematic view of an embodiment of a multi-station processing tool 500 with an inbound load lock 502 and an outbound load lock 504, either or both of which may include a remote plasma source. A robot 506 at atmospheric pressure is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 includes a remote plasma source, the wafer may be exposed to a remote plasma treatment in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 514 includes four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 514 may include one or more matched pairs of ALD and plasma-enhanced ALD process stations. While the depicted processing chamber 514 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog, and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 500. System control software 558 may be configured in any suitable way. For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition (e.g., iodine-containing silicon precursor gases, and nitrogen-containing gases, carrier gases and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 550 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 550.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 550, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 550 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 550, in some implementations, may be a part of or coupled to a computer that is integrated with, coupled to the system, otherwise networked to the system, or a combination thereof. For example, the system controller 550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. It should be understood that the parameters may be specific to the type of process to be performed and the type of tool that the system controller 550 is configured to interface with or control. Thus as described above, the system controller 550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

An experiment as conducted for measuring wet etch rate of silicon nitride material deposited by thermal atomic layer deposition. A 20 Å silicon nitride film was deposited on a first substrate using repeated deposition cycles at a deposition rate of 0.37 Å/cycle, each deposition cycle including: disilane dose, purge, nitrogen plasma dose, purge. The refractive index was measured to be 1.75. The wet etch rate of this silicon nitride film was about 1000 Å/min in 100:1 dilute hydrofluoric acid.

A 20 Å silicon nitride film was deposited on a second substrate using repeated deposition cycles at a deposition rate of 0.1 Å/cycle, each deposition cycle including: $SiBr_4$ dose, purge, nitrogen plasma dose, purge, $N_2$/He treatment at 250° C. The refractive index was measured to be 1.95. The wet etch rate of this silicon nitride film was about 15 Å/min in 100:1 dilute hydrofluoric acid.

Figure 6:
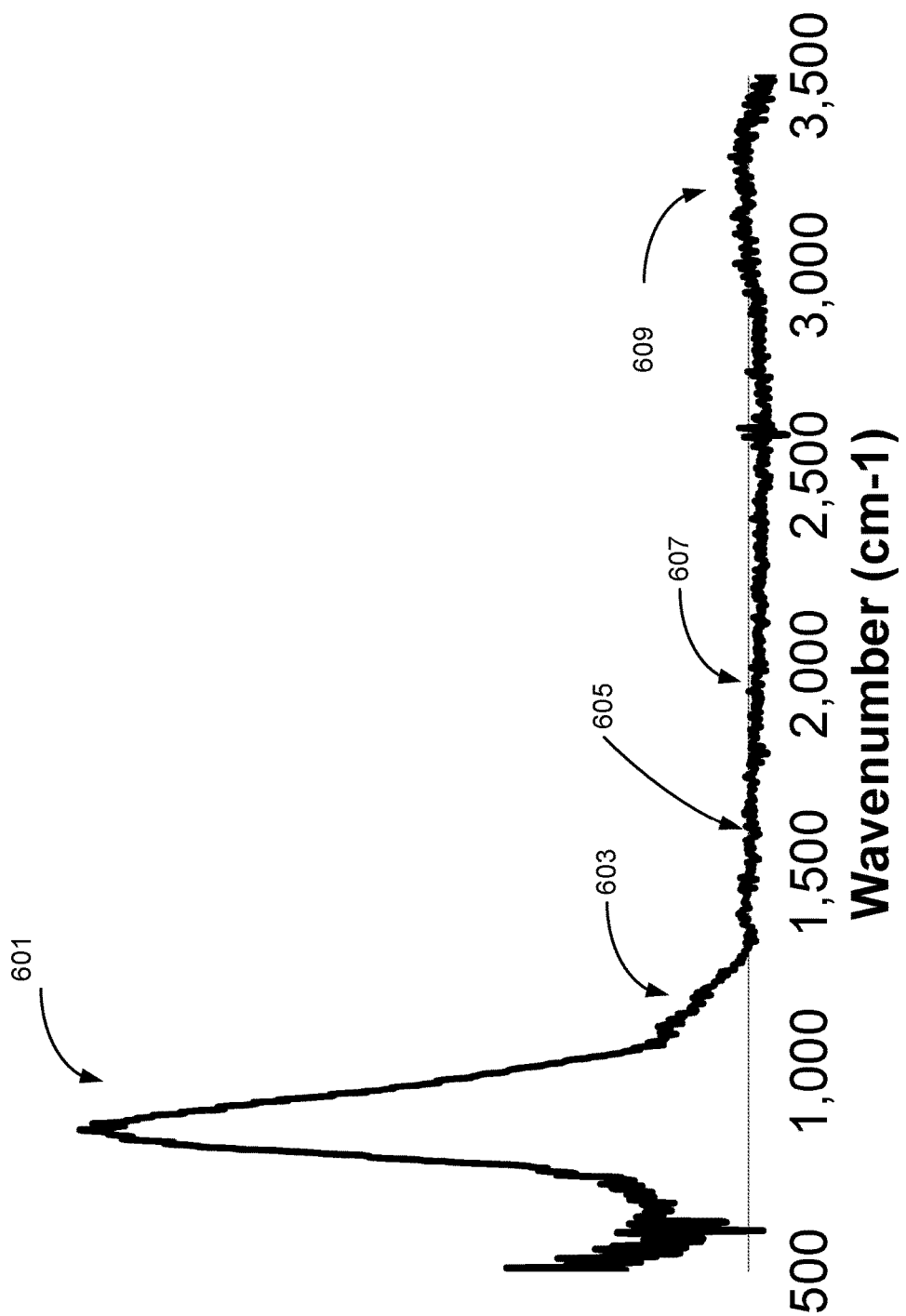
FIG. 6 is a plot depicting a Fourier transform infrared spectroscopy spectrum of experimental results for a silicon nitride film deposited using certain disclosed embodiments.

An FTIR spectrum was obtained for the silicon nitride film. The FTIR spectrum is shown in FIG. 6. Peak 601 shows the absorbance peak for Si—N—Si bonds, peak 603 shows the absorbance peak for $Si_2N$—H bonds, peak 605 shows the absorbance peak for N—$H_2$ bonds, peak 607 shows the absorbance peak for Si—H bonds, and peak 609 shows the absorbance peak for $Si_2N$—H bonds. As shown in FIG. 6, the treated silicon nitride film has low N—H content, and hydrogen content in the film is very low.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing substrates, the method comprising:
   providing a substrate to a chamber;
   depositing a conformal silicon nitride film over the substrate at a first temperature between 100° C. and 250° C. using a deposition cycle, each deposition cycle comprising:
      exposing the substrate to a chlorine-free silicon precursor under conditions allowing the chlorine-free silicon precursor to adsorb onto a surface of the substrate, thereby forming an adsorbed layer of the chlorine-free silicon precursor, and
      exposing the adsorbed layer of the chlorine-free silicon precursor to a nitrogen-containing reactant to form the conformal silicon nitride film over the substrate using a plasma-free thermal reaction; and
   treating the conformal silicon nitride film to form a treated conformal silicon nitride film by exposing the conformal silicon nitride film to a treatment gas and igniting a plasma at a second temperature less than 100° C. to form the treated conformal silicon nitride film,
   wherein the conformal silicon nitride film is deposited over one or more exposed layers of chalcogenide material, and
   wherein the treated conformal silicon nitride film has a wet etch rate in 100:1 hydrofluoric acid of less than about 30 Å/minute.

2. The method of claim 1, wherein the second temperature is between 25° C. and 100° C.

3. The method of claim 1, wherein the second temperature is between 50° C. and 100° C.

4. The method of claim 1, wherein treating the conformal silicon nitride film reduces wet etch rate of the treated conformal silicon nitride film in 100:1 hydrofluoric acid by at least 90%.

5. The method of claim 1, wherein the treatment gas is selected from the group consisting of nitrogen and helium.

6. The method of claim 1, further comprising repeating the deposition cycle to deposit the conformal silicon nitride film.

7. The method of claim 6, wherein treating the conformal silicon nitride film is performed after every deposition cycle.

8. The method of claim 6, wherein treating the conformal silicon nitride film is performed every n deposition cycles, and n is an integer greater than 2.

9. The method of claim 1, wherein the treated conformal silicon nitride film has less than 5% hydrogen in atomic content.

10. The method of claim 1, wherein the conformal silicon nitride film is deposited to a thickness less than about 50 Å.

11. The method of claim 1, wherein the treated conformal silicon nitride film has a density of at least about 2.4 g/cc.

12. The method of claim 1, wherein the treating the conformal silicon nitride film reduces N—H content of the conformal silicon nitride film as measured by FTIR as compared to the conformal silicon nitride film prior to the treating.

13. The method of claim 1, wherein treating the conformal silicon nitride film is performed for a duration between about 1 second and about 10 seconds.

14. The method of claim 1, wherein the chlorine-free silicon precursor selected from the group consisting of iodine-containing silicon precursors, bromine containing silicon precursors, and iodine-and-bromine-containing silicon precursors.

15. The method of claim 1, wherein the chlorine-free silicon precursor is selected from the group consisting of compounds having a chemical formula of $Si_xBr_yI_z$, where x=1, y is an integer between and including 1 and 4, and y+z=4; and compounds having a chemical formula of $Si_xBr_yI_z$, where x=2, y is an integer between and including 1 and 6, and y+z=6.

16. The method of claim 15, wherein the chlorine-free silicon precursor is selected from the group consisting of tetrabromosilane ($SiBr_4$), $SiBr_3I$, $SiBr_2I_2$, $SiBrI_3$, hexabromodisilane ($Si_2Br_6$), $Si_2Br_5I$, $Si_2Br_4I_2$, $Si_2Br_3I_3$, $Si_2Br_2I_4$, $Si_2BrI_5$, and combinations thereof.

17. The method of claim 1, wherein the chlorine-free silicon precursor comprises tetraiodosilane and the nitrogen-containing reactant is ammonia ($NH_3$).

18. A method of processing substrates, the method comprising:
   providing a substrate to a chamber;
   depositing a conformal silicon nitride film over the substrate at a first temperature between 100° C. and 250° C. by:
      exposing the substrate to a chlorine-free silicon precursor under conditions allowing the chlorine-free silicon precursor to adsorb onto a surface of the substrate, thereby forming an adsorbed layer of the chlorine-free silicon precursor, and
      exposing the adsorbed layer of the chlorine-free silicon precursor to a nitrogen-containing reactant to form the conformal silicon nitride film over the substrate using a plasma-free thermal reaction; and
   treating the conformal silicon nitride film by exposing the conformal silicon nitride film to a treatment gas and igniting a plasma at a second temperature less than 100° C. to form a treated conformal silicon nitride film,
   wherein the conformal silicon nitride film is deposited over a memory stack comprising germanium, antimony, and tellurium, and
   wherein the treated conformal silicon nitride film has a wet etch rate in 100:1 hydrofluoric acid of less than about 30 Å/minute.

19. The method of claim 18, wherein the treated conformal silicon nitride film has less than 5% hydrogen in atomic content.

20. The method of claim 18, wherein the treated conformal silicon nitride film has a density of at least about 2.4 g/cc.

21. The method of claim 18, wherein the treating the conformal silicon nitride film reduces N—H content of the conformal silicon nitride film as measured by FTIR as compared to the conformal silicon nitride film prior to the treating.

22. The method of claim 18, wherein the chlorine-free silicon precursor comprises tetraiodosilane and the nitrogen-containing reactant is ammonia ($NH_3$).

* * * * *